(12) United States Patent
Yamamoto

(10) Patent No.: US 8,377,318 B2
(45) Date of Patent: Feb. 19, 2013

(54) MAGNETIC DEVICE MANUFACTURING METHOD

(75) Inventor: Tadashi Yamamoto, Tsukuba (JP)

(73) Assignee: ULVAC, Inc., Kanagawa (JP)

(*) Notice: Subject to any disclaimer, the term of this patent is extended or adjusted under 35 U.S.C. 154(b) by 415 days.

(21) Appl. No.: 12/865,034

(22) PCT Filed: Jan. 23, 2009

(86) PCT No.: PCT/JP2009/051052
§ 371 (c)(1),
(2), (4) Date: Jul. 28, 2010

(87) PCT Pub. No.: WO2009/096328
PCT Pub. Date: Aug. 6, 2009

(65) Prior Publication Data
US 2010/0308012 A1   Dec. 9, 2010

(30) Foreign Application Priority Data
Jan. 29, 2008   (JP) ................. 2008-018155

(51) Int. Cl.
*B44C 1/22* (2006.01)
(52) U.S. Cl. .......... 216/22; 438/710; 438/720; 365/200; 257/9
(58) Field of Classification Search .................. None
See application file for complete search history.

(56) References Cited

U.S. PATENT DOCUMENTS

| | | | | |
|---|---|---|---|---|
| 7,897,950 B2 * | 3/2011 | Shoji | ................. | 257/2 |
| 2002/0135939 A1 * | 9/2002 | Wada | ................. | 360/135 |
| 2003/0147289 A1 * | 8/2003 | Saito et al. | ................. | 365/200 |
| 2005/0186356 A1 | 8/2005 | Hattori et al. | | |
| 2006/0093863 A1 * | 5/2006 | Tsuchiya et al. | ................. | 428/827 |
| 2006/0279882 A1 * | 12/2006 | Honda et al. | ................. | 360/324.12 |
| 2009/0078927 A1 * | 3/2009 | Xiao et al. | ................. | 257/9 |

FOREIGN PATENT DOCUMENTS

| | | |
|---|---|---|
| JP | 11-175927 | 7/1999 |
| JP | 2001-229508 | 8/2001 |
| JP | 2002-038285 | 2/2002 |
| JP | 2002-510142 | 4/2002 |
| JP | 2005-235356 | 9/2005 |
| JP | 2006-040378 | 2/2006 |
| JP | 2007-213716 | 8/2007 |
| WO | WO 99/36947 | 7/1999 |

* cited by examiner

*Primary Examiner* — Binh X Tran
*Assistant Examiner* — David Cathey, Jr.
(74) *Attorney, Agent, or Firm* — Patterson Thuente Christensen Pedersen, P.A.

(57) ABSTRACT

A method for manufacturing a magnetic device that obtains sufficient processing accuracy without increasing mask removal steps. A first mask layer is formed above a magnetic layer using one selected from the group consisting of Ti, Ta, W, and an oxide or a nitride thereof. A second mask layer is formed on the first mask layer using Ru or Cr. A resist pattern is formed on the second mask layer. A second mask pattern is formed by performing reactive ion etching with reactive gas containing oxygen on the second mask layer using the resist pattern. A first mask pattern is formed by performing reactive ion etching with reactive gas containing halogen gas on the first mask layer using the second mask pattern. A magnetic pattern is formed by performing reactive ion etching with reactive gas containing oxygen on the magnetic layer using the first mask pattern.

18 Claims, 4 Drawing Sheets

MAGNETIC DEVICE MANUFACTURING METHOD

PRIORITY CLAIM

The present application is a National Phase entry of PCT Application No. PCT/JP2009/051052, filed Jan. 23, 2009, which claims priority from Japanese Patent Application Number 2008-018155, filed Jan. 29, 2008, the disclosures of which are hereby incorporated by reference herein in their entirety.

TECHNICAL FIELD

The present invention relates to a method for manufacturing a magnetic device.

BACKGROUND ART

The magnetic properties of a transition metal material are widely used by various types of magnetic devices, such as a hard disk drive (HDD), a magnetoresistive random access memory (MRAM), and magnetic sensor. In the technology for manufacturing such magnetic devices, there have been demands for information storages with higher density and sensors with higher accuracy. As a result, processing techniques for miniaturizing magnetic patterns have been diligently developed. In the prior art, as etching techniques used for micro-processing a magnetic thin film, ion milling, which performs physical etching on a magnetic thin film, and reactive ion etching, which performs physical-chemical processing on a magnetic thin film, have been employed.

In ion milling, a magnetic thin film is etched by colliding ions of argon or the like against the magnetic thin film to partially force out portions of the magnetic thin film from its surface. In ion milling, the subject of the etching is the entire region that ions collide against. Thus, etching selectivity is difficult to obtain, and there is a limit to the miniaturization of magnetic patterns. In contrast, in reactive ion etching, the magnetic thin film is placed in a plasma of reactive gas, and the magnetic thin film is removed through physical-chemical reaction between the magnetic material and the reactive gas. This allows for reactive ion etching to have a high etching selectivity in comparison with ion milling.

In the reactive ion etching for magnetic thin films, a gas mixture of $O_2$ and $Cl_2$ or a gas mixture of CO and $NH_3$ is used as the reactive gas. In a micro-processing technique for magnetic thin films, to increase the selection ratio of the magnetic thin film relative to a mask, a mask material having high etching resistance has been proposed for such a reactive gas in the prior art (e.g., patent documents 1 to 4).

In patent documents 1 to 3, a metal layer is formed between a magnetic thin film and a resist pattern, a hard mask is formed by etching the metal layer using the resist pattern, and a magnetic pattern is formed by etching the magnetic thin film using the hard mask. Patent document 1 proposes as the material of a hard mask the use of any one of the materials including Ti, Mg, Al, Ge, Pt, Pd, or an alloy thereof. Patent document 2 uses a metal (e.g., Ta, W, Zr, Hf, etc.) of which melting point or boiling point rises when changed to nitride or carbide. Patent document 3 uses Ti, Al, Ta, W, Co, Mo, Cu, Ni, Fe, and an oxide, nitride, fluoride, boride, and carbide thereof. Patent documents 1 to 3 select the above-described mask material and increase the selection ratio in a $CO-NH_3$ system and an $O_2-Cl_2$ system.

In patent document 4, a mask precursor layer and a metal layer are first formed between a magnetic thin film and a resist pattern, a second hard mask is formed by etching the metal layer using the resist pattern, and a first hard mask is formed by etching the mask precursor layer using the second hard mask. A magnetic pattern is formed by etching the magnetic thin film using the first hard mask. Patent document 4 increases the selection ratio between the layers of the resist pattern, the metal layer, and the precursor layer. This increases the selection ratio of the magnetic layer relative to the precursor layer and increases the processing accuracy of the magnetic pattern.

FIGS. 8A to 8D are process charts illustrating a method for manufacturing a magnetic disk used as a perpendicular magnetic recording type HDD. In the magnetic disk manufacturing method, first, a magnetic layer 52, a protective layer 53, a hard mask layer 54, and a resist pattern RM are sequentially stacked from an upper surface side of a substrate 51, as shown in FIG. 8A. For example, when $CoCrPt-SiO_2$ and Ti are respectively selected as the magnetic material and the mask material, the resist pattern RM having a film thickness of 150 nm and the hard mask layer 54 having a film thickness of 20 nm are stacked on the magnetic layer 52 having a film thickness of 20 nm. The protective layer 53 is a thin film layer for protecting the magnetic layer 52 when etching the hard mask layer 54 and is, for example, a diamond like carbon (DLC) layer having a film thickness of several nanometers.

Then, referring to FIG. 8B, reactive ion etching using the resist pattern RM is performed on the hard mask layer 54. Referring to FIG. 8C, a hard mask 54a is formed by ashing the resist pattern RM. Then, referring to FIG. 8D, reactive ion etching using the hard mask 54a is performed on the protective layer 53 and the magnetic layer 52 to form a magnetic pattern 52a.

In this case, when the magnetic pattern 52a has a design rule (line width and space width) that is less than or equal to 100 nm, the plasma resistance of the resist pattern RM becomes drastically low. This advances deformation of the resist pattern RM, and the hard mask 54a becomes tapered. As a result, the side surface of the magnetic pattern 52a becomes inclined (e.g., inclined 70° or less) relative to the main surface of the substrate 51. As a result, sufficient processing accuracy for performing perpendicular magnetic recording cannot be obtained.

Patent document 4 proposes a hard mask having a stacked structure but does not thoroughly discuss the etching selectivity between the layers of the resist pattern RM, the hard mask layer 54, and the magnetic layer 52. Further, patent document 4 does not thoroughly discuss the mask material for the etching process. Additionally, in patent document 4, when mask layers increase, the number of steps for removing the mask increases. This lowers the productivity of the magnetic device.

Patent Document 1: Japanese Laid-Open Patent Publication NO. 11-175927
Patent Document 2: Japanese Laid-Open Patent Publication NO. 2002-38285
Patent Document 3: Japanese Laid-Open Patent Publication NO. 2002-510142
Patent Document 4: Japanese Laid-Open Patent Publication NO. 2001-229508

SUMMARY OF THE INVENTION

The present invention provides a method for manufacturing a magnetic device that obtains sufficient processing accuracy without increasing the number of steps for mask removal.

One aspect of a method for manufacturing a magnetic device includes the steps of forming a magnetic layer on a substrate, forming a first mask layer above the magnetic layer using any one selected from a group consisting of Ti, Ta, W, and an oxide or a nitride thereof, forming a second mask layer using Ru or Cr on the first mask layer, forming a resist pattern on the second mask layer, forming a second mask pattern by performing reactive ion etching with reactive gas containing oxygen on the second mask layer using the resist pattern as a mask, forming a first mask pattern by performing reactive ion etching with reactive gas containing halogen gas on the first mask layer using the second mask pattern as a mask, and forming a magnetic pattern by performing reactive ion etching with reactive gas containing oxygen on the magnetic layer using the first mask pattern as a mask.

DESCRIPTION OF REFERENCE CHARACTERS

RM: resist pattern, 10: magnetic disk serving as magnetic device, 11: substrate, 15: recording layer serving as magnetic layer, 15A: recording pattern serving as magnetic pattern, 22: first mask layer, 22A: first mask pattern, 23: second mask layer, 23A: second mask pattern

DETAILED DESCRIPTION OF THE EMBODIMENTS

Figure 1:
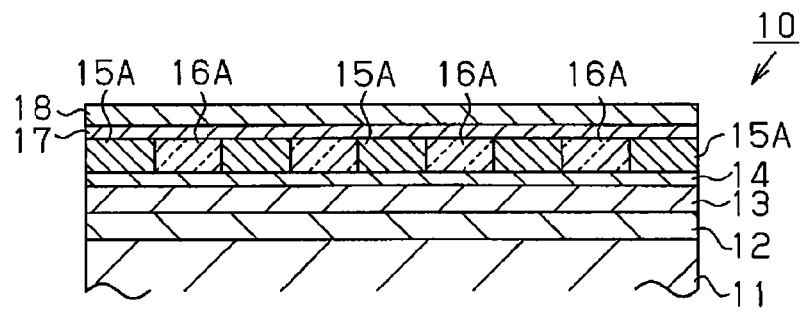
FIG. 1 is a cross-sectional view showing a magnetic recording medium.

A magnetic recording medium serving as a magnetic device of one embodiment will now be discussed with reference to FIG. 1. The magnetic recording medium is a magnetic disk, such as a discrete track medium or a patterned track medium using the perpendicular magnetic recording technique. FIG. 1 is a cross-sectional side view schematically showing part of a magnetic disk 10.

In FIG. 1, the magnetic disk 10 has a substrate 11 on which are stacked an underlying layer 12, a soft magnetic layer 13, an orientation layer 14, recording patterns 15A serving as a magnetic layer, nonmagnetic patterns 16A, a protective layer 17, and a lubricating layer 18. The substrate 11 may be a nonmagnetic substrate, such as an Al substrate or a glass substrate.

The underlying layer 12 is a buffer layer for moderating the surface roughness of the substrate 11 and may function as a layer that strengthens a substrate of glass or the like and obtains adhesiveness between the substrate 11 and the soft magnetic layer 13. The underlying layer 12 also functions as a seed layer that determines the crystalline orientation of the upper layer and defines the orientation of the soft magnetic layer 13 that is stacked. The underlying layer 12 may be a non-crystalline or microcrystalline alloy containing at least one selected from the group consisting of Ta, Ti, W, and Cr or may be a stacked film thereof.

The soft magnetic layer 13 is a magnetic layer having soft magnetic properties and enhances the vertical orientation of the recording pattern 15A. As the soft magnetic layer 13, a non-crystalline or microcrystalline alloy containing at least one selected from the group consisting of Fe, Co, Ni, Al, Si, Ta, Ti, Zr, Hf, V, Nb, C, and B or a stacked film of an alloy thereof may be used.

The orientation layer 14 is a layer that determines the crystalline orientation of the recording pattern 15A. As the orientation layer 14, for example, a single layer structure of Ru, Ta, Pt, MgO, or the like or a multi-layer structure or the like in which Ru and Ta are stacked on MgO may be used.

The recording patterns 15A form a layer separated into data tracks, which are for recording and reproducing, and includes an upper surface parallel to the surface of the substrate 11. The recording patterns 15A have different shapes and sizes in the data region and the servo region. FIG. 1 shows part of a data region with an equal pitch width so as to facilitate description of the stacked structure of the magnetic disk 10. To increase the surface recording density, it is preferable that each recording pattern 15A be a perpendicular magnetization film having a magnetization facilitation axis extending in a normal direction (film thickness direction of the recording pattern 15A) of the substrate 11.

The magnetic material forming the recording pattern 15A may be, for example, at least one type of ferromagnetic material selected from the group consisting of Co, Ni, Fe, and a Co alloy. Alternatively, the magnetic material forming the recording pattern 15A may be a granula film containing $SiO_2$, $Al_2O_3$, and $Ta_2O_5$ and mainly formed from CoCr, CoPt, CoCrPt, or the like.

The nonmagnetic patterns 16A form a layer for magnetically isolating each recording pattern 15A and fill the gaps between the adjacent recording patterns 15A. The upper surface of each nonmagnetic pattern 16A is flush with the upper surface of the adjacent recording pattern 15A. The nonmagnetic pattern 16A may be $SiO_2$, $Al_2O_3$, $Ta_2O_5$, $MgF_2$, or the like.

The protective layer 17 is a layer for protecting the recording pattern 15A and the nonmagnetic pattern 16A and may be diamond like carbon (DLC), carbon nitride aluminum oxide, zirconium oxide, or the like having a film thickness of 0.5 to 15 nm. The lubricating layer 18 is a layer for sliding the magnetic head in the planar direction to prevent damages from being inflicted to the magnetic disk 10 and the magnetic head when the magnetic disk 10 comes into contact with the magnetic head.

A method for manufacturing the magnetic disk 10 will now be discussed. FIGS. 2 to 6 are process charts showing the manufacturing method of the magnetic disk 10.

Figure 2:
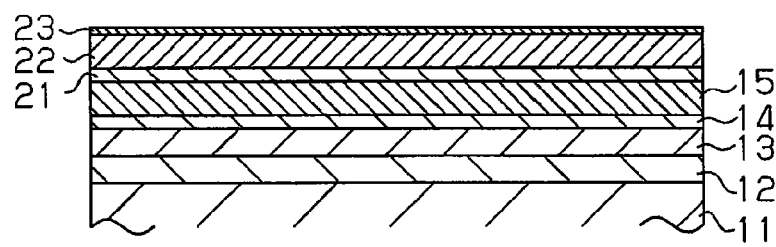
FIG. 2 is a process chart showing a manufacturing method of the magnetic recording medium.

Referring to FIG. 2, sputtering, plating, or the like are performed to sequentially stack the underlying layer 12, the soft magnetic layer 13, the orientation layer 14, and the recording layer 15 on the upper surface of the substrate 11. Then, an etching protective layer 21, a first mask layer 22, and a second mask layer 23 are sequentially stacked on the upper surface of the recording layer 15.

The etching protective layer 21 is a layer for protecting the magnetic properties of the recording layer 15 when patterning the recording layer 15 and may be, for example, DLC having a film thickness of 0.5 to 15 nm.

The first mask 22 is a layer formed from any one selected from the group consisting of Ti, Ta, W, and an oxide or a nitride thereof and has a film thickness of, for example, 5 nm to 100 nm.

The second mask layer 23 is a layer formed from either one of Ru and Cr and has a film thickness of 2 nm to 10 nm. The second mask layer 23 is formed to be thinner than the resist pattern RM (e.g., 150 nm), the first mask layer 22, and the recording layer 15 (e.g., 20 nm).

Figure 3:
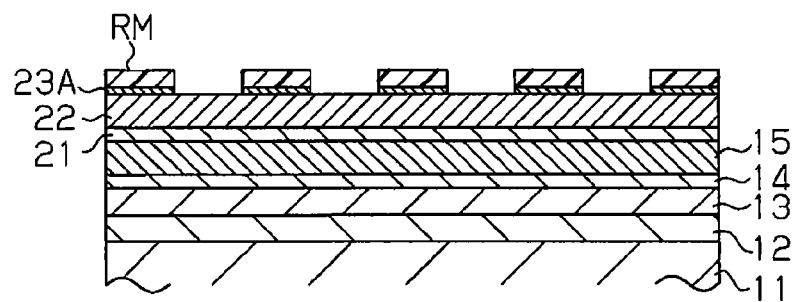
FIG. 3 is a process chart showing the manufacturing method of the magnetic recording medium.

Referring to FIG. 3, an application film of photoresist is formed on the second mask layer 23, and the resist pattern RM is formed by performing an exposure-development process on the application film. Reactive ion etching using the resist pattern RM is then performed on the second mask layer 23. This forms a second mask pattern 23A.

In this state, the reactive ion etching uses a reactive gas containing $O_2$. The resistance of the resist pattern RM is generally low with respect to oxygen plasma. Thus, an etching process that uses oxygen cannot be employed. However, in the present embodiment, as will be described later, the selection ratio of the first mask layer 22 relative to the second mask layer 23 is extremely large in the etching process using reactive gas that is free from oxygen. This allows for the second mask layer 23 to be thinner than normal. Further, the reaction of the second mask layer 23 and oxygen generates a low melting point oxide, for example, $RuO_4$ (boiling point: 130° C.), $CrO_3$ (boiling point: 250° C.), and $CrO_2Cl_2$ (boiling point: 117° C.). Thus, the etching speed of the second mask layer 23 is extremely high. As a result, high accuracy etching of the second mask layer 23 using the resist pattern RM may be performed. Since the second mask layer 23 is thin, the second mask pattern 23A may be formed with higher processing accuracy.

The reactive gas may be formed by mixing a halogen gas of at least one selected from the group consisting of $Cl_2$, $BCl_3$, $CF_4$, $C_4F_8$, $C_3F_8$, HI, and $SiCl_4$ with $O_2$. More preferably, the reactive gas may be formed by a gas mixture of $O_2$ and $Cl_2$. In other words, the reactive gas may only need to have an $O_2$ concentration that obtains a sufficiently high selection ratio for the second mask layer 23 relative to the resist pattern RM.

Figure 4:
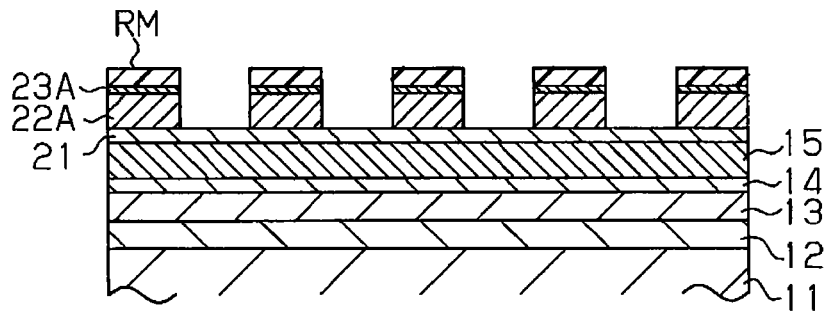
FIG. 4 is a process chart showing the manufacturing method of the magnetic recording medium.

Referring to FIG. 4, reactive ion etching that uses the second mask pattern 23A is performed on the first mask layer 22. This forms a first mask pattern 22A.

In this case, the reactive gas used in the reactive ion etching may be a gas containing halogen gas. This allows for the generation of a low melting point halide through the reaction of the first mask layer 22 and the halogen. Thus, the selection ratio of the first mask layer 22 relative to the second mask layer 23 has a sufficiently high value (value exceeding 100) without adversely affecting the selection ratio of the recording layer 15 relative to the first mask layer 22. As a result, the shape of the second mask pattern 23A may be maintained, and the first mask pattern 22A may thereby be formed with a higher processing accuracy.

The halogen gas may contain at least any one of a halogen gas selected from the group consisting of $Cl_2$, $BCl_3$, $CF_4$, $C_4F_8$, $C_3F_8$, HI, and $SiCl_4$.

Figure 5:
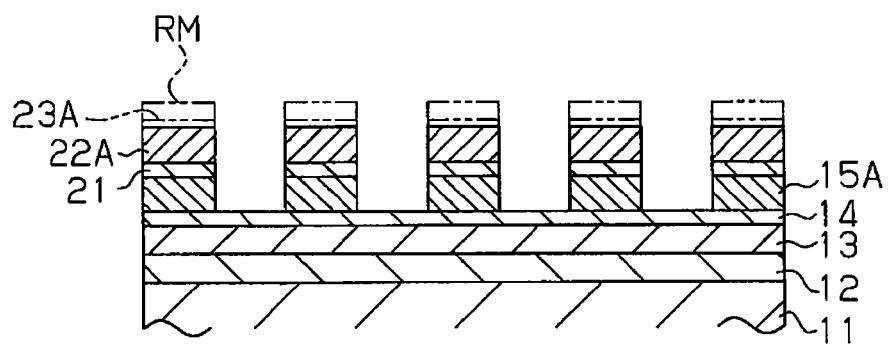
FIG. 5 is a process chart showing the manufacturing method of the magnetic recording medium.

Referring to FIG. 5, ashing using $O_2$ is performed on the resist pattern RM to remove the resist pattern RM. Reactive ion etching using the first mask pattern 22A is then performed on the protective layer 21 and the recording layer 15. This forms the recording pattern 15A. The recording pattern 15A is formed with a higher processing accuracy since the second mask pattern 23A and the first mask pattern 22A are formed with a higher processing accuracy.

In this case, the reactive gas used for the reactive ion etching may be a gas containing $O_2$. This etches the recording layer 15. Further, the second mask pattern 23A is removed by the reaction of the second mask pattern 23A with oxygen. Moreover, when the resist pattern RM is sufficiently thin or the resistance to oxygen plasma is low, the resist pattern RM may be removed in addition to the second mask pattern 23A. Thus, the ashing that uses oxygen may become unnecessary.

Figure 6:
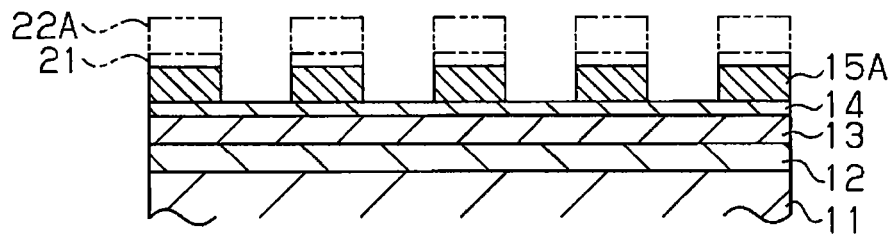
FIG. 6 is a process chart showing the manufacturing method of the magnetic recording medium.

Referring to FIG. 6, reactive ion etching that uses halogen gas is performed on the first mask pattern 22A and the etching protective layer 21 to remove the first mask pattern 22A and the etching protective layer 21. Then, a halogen gas elimination process using $H_2$ plasma is performed on the recording pattern 15A, and the halogen gas adsorbed to the recording pattern 15A is eliminated. This forms the recording pattern 15A with a desired shape, for example, with a side surface that is orthogonal to the main surface of the substrate 11.

Example 1

The ratio of the etching rate of the second mask layer 23 relative to the resist pattern RM and the ratio of the etching rate of the first mask layer 22 relative to the second mask layer 23, that is, the selection ratio of the second mask layer 23 relative to the resist pattern RM and the selection ratio of the first mask layer 22 relative to the second mask layer 23 will now be discussed.

A Ti film was formed on a glass disk substrate as the first mask layer 22, an Ru film was formed on a different glass disk substrate as the second mask layer 23, and an electron beam exposure resist (EB resist) film was formed on a further different glass disk substrate as the resist pattern RM. Ion etching was performed under the condition in which the pressure was 5 Pa with gas mixture containing 4 sccm to 28 sccm of $O_2$ and 1 sccm of $Cl_2$ for each of the Ti film, the Ru film, and the EB resist film. The etching rate was measured for each of the Ti film, the Ru film, and the EB resist film.

Figure 7:
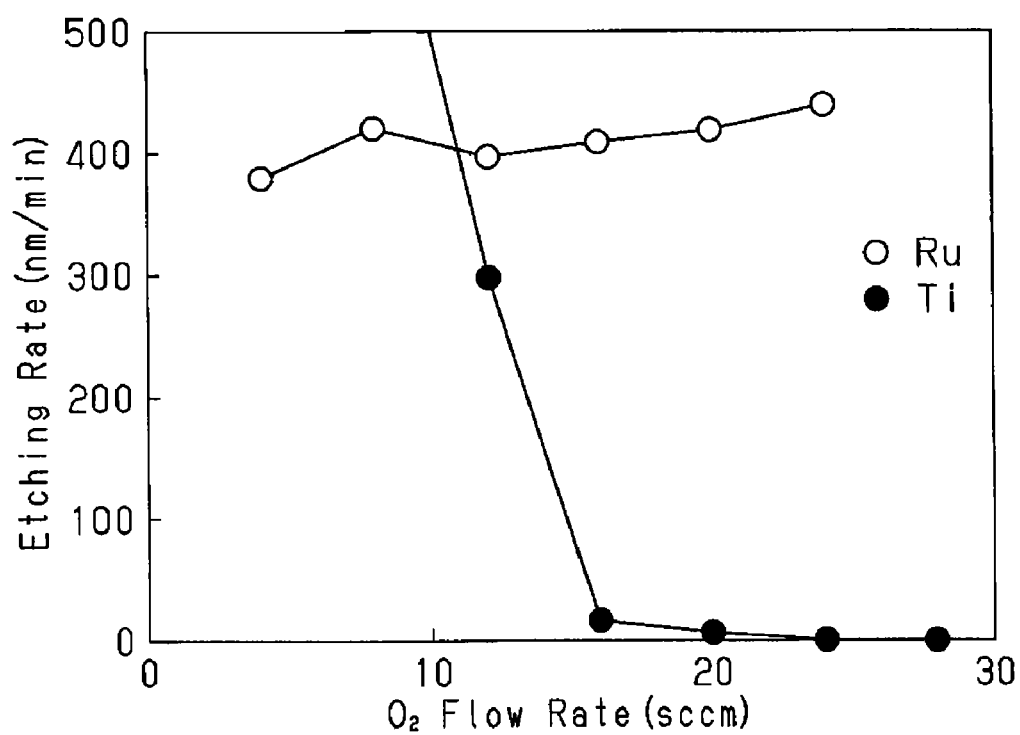
FIG. 7 is a view showing an etching rate of a Ru film and a Ti film.
Figure 8A:
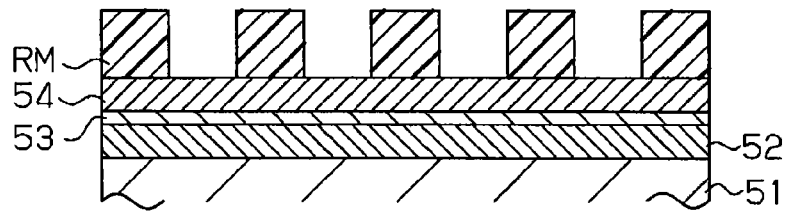
FIGS. 8A to 8D are process charts showing a prior art example of a method for manufacturing a magnetic recording medium.
Figure 8B:
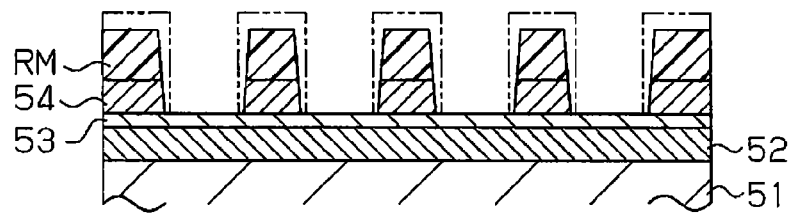
Figure 8C:
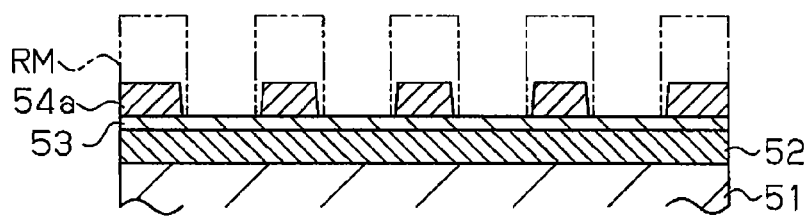
Figure 8D:
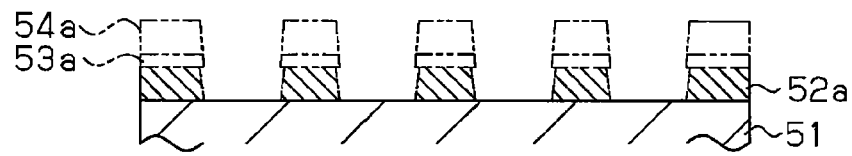

Referring to FIG. 7, as the $O_2$ flow rate increased to 16 sccm, the etching rate of the Ti film decreased drastically. As the $O_2$ flow rate increased from 16 sccm to 28 sccm, the etching rate of the Ti film was maintained at a low value of 10 nm/min or less. This suggests that the reaction of Ti and Cl, that is, the etching reaction of the Ti film was dominant in the low $O_2$ flow rate range and that the reaction of Ti and O, that is, the oxidation reaction of Ti was dominant in the high $O_2$ flow rate range.

When the $O_2$ flow rate was 4 sccm to 24 sccm, the etching rate of the Ru film was continuously remained to be approximately 400 nm/min. This suggests that the oxidation reaction of Ru, that is, the etching reaction of the Ru film continued to advance stably in both of the high $O_2$ flow rate range and the low $O_2$ flow rate range. The etching rate of the EB resist was 180 nm/min in the high $O_2$ flow rate range.

It was thus found that the $C_2$—$O_2$ system ($O_2$: 16 sccm to 24 sccm) ion etching resulted in the ratio of the etching rate of the Ru layer relative to the resist layer, that is, the selection ratio of the Ru layer relative to the resist layer being approximately 2.2. It was also found that the selection ratio of the Ti layer relative to the Ru layer had a high value exceeding 100. These selection ratios were recognized in the pressure range of 0.2 Pa to 5 Pa during ion etching.

Example 2

A Ti film was formed on a glass disk substrate as the first mask layer 22, an Ru film was formed on a different glass disk substrate as the second mask layer 23, and an EB resist film was formed on a further different glass disk substrate as the resist pattern RM. Ion etching was performed under a pressure of 0.5 Pa using a gas mixture containing $Cl_2$ and $BCl_3$ for each of the Ti film, the Ru film, and the EB resist film. Further, the etching rate was measured for each of the Ti film, the Ru film, and the EB resist film.

In the $C_2$—$BCL_3$ system, the etching rate of the Ru film was approximately 0 nm/min, the etching rate of the Ti film was approximately 600 nm/min, and the etching rate of the EB resist film was 150 nm/min. Thus, it was found that $C_2$—$BCl_3$ ion etching obtained a selection ratio of the Ti layer relative to the Ru layer with a high value exceeding 100. The selection ratio of the Ti layer relative to the resist film was about 4.0. Thus, compared to when using the resist pattern as a mask, the selection ratio of the Ti film was increased to 25 times or greater by using the Ru film as the mask. These selection ratios were recognized in the pressure range of 0.2 Pa to 3 Pa during ion etching.

Example 3

A Ti film was formed on a glass disk substrate as the first mask layer 22, an Ru film was formed on a different glass disk substrate as the second mask layer 23, and CoCrPt—$SiO_2$ film was formed on a further different glass disk substrate as the recording pattern 15A. Ion etching was performed under a pressure of 0.5 Pa using a gas mixture containing Ar, $O_2$, and $Cl_2$, and the etching rate was measured for each of the Ti film, the Ru film, and the CoCrPt—$SiO_2$ film.

In the Ar—$O_2$—$Cl_2$ system, the etching rate of the Ru film was approximately 30 nm/min, the etching rate of the Ti film was approximately 0 nm/min (0.2 nm/min or less), and the etching rate of the CoCrPt—$SiO_2$ film was approximately 40 nm/min. Thus, it was found that Ar—$O_2$—$Cl_2$ ion etching obtained a selection ratio of the Ti layer relative to the Ru layer with a high value exceeding 100. It was also found that the Ru film could be etched when etching the CoCrPt—$SiO_2$ film. The selection ratios were recognized in the pressure range of 0.2 Pa to 3 Pa during ion etching.

The manufacturing method of the magnetic disk according to the embodiment has the advantages described below.

(1) The first mask layer 22 is formed above the recording layer 15 using any one selected from the group consisting of Ti, Ta, W, and an oxide or a nitride thereof. Accordingly, the first mask 22 uses a material that forms a high melting point oxide through reaction with oxygen and forms a low melting point chloride through reaction with chlorine. The second mask layer 23 is formed on the first mask layer 22 using either Ru or Cr. Accordingly, the second mask layer 23 uses a material that forms a low melting point oxide through reaction with oxygen and forms a high melting point chloride through reaction with chlorine. The second mask pattern 23A is formed by the reactive ion etching using gas containing $O_2$ as an etchant, and the first mask pattern 22A is formed by the reactive ion etching using halogen gas as an etchant.

Accordingly, a sufficiently high selection ratio is obtained between the second mask layer 23 and the first mask layer 22. Thus, the second mask layer 23 is sufficiently thin. This shapes the second mask pattern 23A, the first mask pattern 22A, and the recording pattern 15A with higher accuracy (2) Moreover, the recording layer 15 is etched by the reactive ion etching using $O_2$. This simultaneously forms the recording pattern 15A and removes the second mask pattern 23A. This reduces the number of steps for mask removal related to the second mask pattern 23A. Further, the resist pattern RM is thin since the second mask layer 23 is thin. Thus, in lieu of ashing that generally uses $O_2$, the removal of the resist pattern RM and the removal of the second mask pattern 23A may be performed simultaneously in this step.

(3) The second mask layer 23, which is formed to have a film thickness of 2 nm to 10 nm, is thinner than the resist pattern RM and thinner than the recording layer 15. By making the second mask layer 23 thinner than the resist pattern RM, the second mask pattern 23A is shaped with high accuracy. Further, by making the second mask layer 23 thinner than the recording layer 15, the removal of the second mask pattern 23A is ensured in the etching step of the recording layer 15.

(4) It is preferable that the second mask layer 23 be formed to be thinner than the first mask layer 22, which is formed to be thinner than the recording layer 15. In this case, the removal of the second mask pattern 23A is further ensured in the etching step of the recording layer 15.

(5) It is preferable that reactive gas containing halogen and oxygen be used as the etchant of the second mask layer 23. In this case, a higher selection ratio is obtained between the resist pattern and the second mask layer in comparison to when using only oxygen as the reactive gas.

The embodiment discussed above may be practiced in the forms described below.

The magnetic device is not limited to the magnetic disk 10 for an HDD and may be embodied in an MRAM, a magnetic sensor, or the like. In other words, the manufacturing method of the above-described embodiment may be applied to a magnetic device in which magnetic patterns are formed by performing reactive ion etching on a magnetic layer.

The thickness of the second mask layer 23 may be the same as the first mask layer 22 or thicker than the first mask layer 22.

The invention claimed is:

1. A method for manufacturing a magnetic device comprising the steps of:
    forming a magnetic layer on a substrate;
    forming a first mask layer above the magnetic layer using any one selected from the group consisting of Ti, Ta, W, and an oxide or a nitride thereof;
    forming a second mask layer using Ru or Cr on the first mask layer;
    forming a resist pattern on the second mask layer;
    forming a second mask pattern by performing reactive ion etching with reactive gas containing oxygen on the second mask layer using the resist pattern as a mask;
    forming a first mask pattern by performing reactive ion etching with reactive gas containing halogen gas on the first mask layer using the second mask pattern as a mask; and
    forming a magnetic pattern by performing reactive ion etching with reactive gas containing oxygen on the magnetic layer using the first mask pattern as a mask.

2. The method for manufacturing a magnetic device according to claim 1, wherein the step of forming a second mask layer includes forming the second mask layer to be thinner than the resist pattern and thinner than the magnetic layer with a film thickness of 2 nm to 10 nm.

3. The method for manufacturing a magnetic device according to claim 2, wherein:
    the step of forming a first mask layer includes forming the first mask layer to be thinner than the magnetic layer; and
    the step of forming a second mask layer includes forming the second mask layer to be thinner than the first mask layer.

4. The method for manufacturing a magnetic device according to claim 1, wherein:
    the step of forming a second mask pattern includes performing reactive ion etching on the second mask layer with reactive gas containing a halogen gas of at least one selected from the group, which consists of $Cl_2$, $BCl_3$, $CF_4$, $C_4F_8$, $C_3F_8$, HI, and $SiCl_4$, and oxygen; and the step of forming a first mask pattern includes performing reactive ion etching on the first mask layer with reactive gas containing a halogen gas of at least one selected from the group consisting of $Cl_2$, $BCl_3$, $CF_4$, $C_4F_8$, $C_3F_8$, HI, and $SiCl_4$.

5. The method for manufacturing a magnetic device according to claim 1, wherein the step of forming a magnetic pattern includes simultaneously forming the magnetic pattern and removing the second mask pattern through reactive ion etching with the reactive gas containing oxygen.

6. The manufacturing method of the magnetic device according to claim 5, wherein the step of forming a magnetic pattern further includes simultaneously forming the magnetic pattern, removing the second mask pattern, and removing the resist pattern through reactive ion etching with the reactive gas containing oxygen.

7. The method for manufacturing a magnetic device according to claim 2, wherein:
the step of forming a second mask pattern includes performing reactive ion etching on the second mask layer with reactive gas containing a halogen gas of at least one selected from the group, which consists of $Cl_2$, $BCl_3$, $CF_4$, $C_4F_8$, $C_3F_8$, HI, and $SiCl_4$, and oxygen; and
the step of forming a first mask pattern includes performing reactive ion etching on the first mask layer with reactive gas containing a halogen gas of at least one selected from the group consisting of $Cl_2$, $BCl_3$, $CF_4$, $C_4F_8$, $C_3F_8$, HI, and $SiCl_4$.

8. The method for manufacturing a magnetic device according to claim 7, wherein the step of forming a magnetic pattern includes simultaneously forming the magnetic pattern and removing the second mask pattern through reactive ion etching with the reactive gas containing oxygen.

9. The manufacturing method of the magnetic device according to claim 8, wherein the step of forming a magnetic pattern further includes simultaneously forming the magnetic pattern, removing the second mask pattern, and removing the resist pattern through reactive ion etching with the reactive gas containing oxygen.

10. The method for manufacturing a magnetic device according to claim 3, wherein:
the step of forming a second mask pattern includes performing reactive ion etching on the second mask layer with reactive gas containing a halogen gas of at least one selected from the group, which consists of $Cl_2$, $BCl_3$, $CF_4$, $C_4F_8$, $C_3F_8$, HI, and $SiCl_4$, and oxygen; and
the step of forming a first mask pattern includes performing reactive ion etching on the first mask layer with reactive gas containing a halogen gas of at least one selected from the group consisting of $Cl_2$, $BCl_3$, $CF_4$, $C_4F_8$, $C_3F_8$, HI, and $SiCl_4$.

11. The method for manufacturing a magnetic device according to claim 10, wherein the step of forming a magnetic pattern includes simultaneously forming the magnetic pattern and removing the second mask pattern through reactive ion etching with the reactive gas containing oxygen.

12. The manufacturing method of the magnetic device according to claim 11, wherein the step of forming a magnetic pattern further includes simultaneously forming the magnetic pattern, removing the second mask pattern, and removing the resist pattern through reactive ion etching with the reactive gas containing oxygen.

13. The method for manufacturing a magnetic device according to claim 2, wherein the step of forming a magnetic pattern includes simultaneously forming the magnetic pattern and removing the second mask pattern through reactive ion etching with the reactive gas containing oxygen.

14. The manufacturing method of the magnetic device according to claim 13, wherein the step of forming a magnetic pattern further includes simultaneously forming the magnetic pattern, removing the second mask pattern, and removing the resist pattern through reactive ion etching with the reactive gas containing oxygen.

15. The method for manufacturing a magnetic device according to claim 3, wherein the step of forming a magnetic pattern includes simultaneously forming the magnetic pattern and removing the second mask pattern through reactive ion etching with the reactive gas containing oxygen.

16. The manufacturing method of the magnetic device according to claim 15, wherein the step of forming a magnetic pattern further includes simultaneously forming the magnetic pattern, removing the second mask pattern, and removing the resist pattern through reactive ion etching with the reactive gas containing oxygen.

17. The method for manufacturing a magnetic device according to claim 4, wherein the step of forming a magnetic pattern includes simultaneously forming the magnetic pattern and removing the second mask pattern through reactive ion etching with the reactive gas containing oxygen.

18. The manufacturing method of the magnetic device according to claim 17, wherein the step of forming a magnetic pattern further includes simultaneously forming the magnetic pattern, removing the second mask pattern, and removing the resist pattern through reactive ion etching with the reactive gas containing oxygen.

* * * * *